(12) United States Patent
Noda (10) Patent No.: US 8,349,706 B2
(45) Date of Patent: Jan. 8, 2013

(54) SEMICONDUCTOR SURFACE PROTECTING METHOD

(75) Inventor: Kazuki Noda, Sagamihara (JP)

(73) Assignee: 3M Innovtive Properties Company, St. Paul, MN (US)

( * ) Notice: Subject to any disclaimer, the term of this patent is extended or adjusted under 35 U.S.C. 154(b) by 795 days.

(21) Appl. No.: 10/595,678

(22) PCT Filed: Oct. 15, 2004

(86) PCT No.: PCT/US2004/034134
§ 371 (c)(1),
(2), (4) Date: May 4, 2006

(87) PCT Pub. No.: WO2005/053017
PCT Pub. Date: Jun. 9, 2005

(65) Prior Publication Data
US 2007/0148916 A1  Jun. 28, 2007

(30) Foreign Application Priority Data

Nov. 12, 2003  (JP) .................................. 2003-382717

(51) Int. Cl.
*H01L 21/30* (2006.01)
(52) U.S. Cl. ........ 438/459; 257/738; 257/778; 257/737; 438/106
(58) Field of Classification Search .................. 438/780, 438/781, 100, 459; 257/738, 778, 783
See application file for complete search history.

(56) References Cited

U.S. PATENT DOCUMENTS

| | | |
|---|---|---|
| 2,843,555 A | 7/1958 | Berridge |
| 3,159,662 A | 12/1964 | Ashby |
| 3,178,464 A | 4/1965 | Pierpoint |
| 3,220,972 A | 11/1965 | Lamoreaux |
| 3,313,773 A | 4/1967 | Lamoreaux |
| 3,410,886 A | 11/1968 | Joy |
| 3,470,225 A | 9/1969 | Knorre et al. |
| 3,567,755 A | 3/1971 | Seyfried et al. |
| 3,715,334 A | 2/1973 | Karstedt |
| 3,775,452 A | 11/1973 | Karstedt |
| 3,814,730 A | 6/1974 | Karstedt |

(Continued)

FOREIGN PATENT DOCUMENTS

CN  1255522 A  6/2000

(Continued)

OTHER PUBLICATIONS

Clarson et al., Siloxane Polymers, PTR Prentice Hall, Englewood Cliffs, New Jersey, (1993).

(Continued)

*Primary Examiner* — David Vu
*Assistant Examiner* — Caleb Henry
(74) *Attorney, Agent, or Firm* — Yen T. Florcak (57) ABSTRACT

Provided are a semiconductor surface protecting method and surface protecting sheet employing a material having adequate conformability for irregularities on semiconductor wafer circuit sides and sufficient rigidity as a support during grinding, and which does not become fluid with repeated temperature increases. Also provided is a surface protecting sheet for protection of the circuit side in the step of back side grinding of a semiconductor wafer, the surface protecting sheet having a polymeric film material with a surface protecting layer thereon that may become fluid upon heating and which hardens upon exposure to radiation or upon heating.

11 Claims, 2 Drawing Sheets

U.S. PATENT DOCUMENTS

| | | | |
|---|---|---|---|
| 3,814,731 A | 6/1974 | Nitzsche et al. | |
| 4,189,230 A | 2/1980 | Zasio | |
| 4,276,252 A | 6/1981 | Kreis et al. | |
| 4,288,345 A | 9/1981 | Ashby et al. | |
| 4,308,331 A | 12/1981 | Narita et al. | |
| 4,313,988 A | 2/1982 | Koshar et al. | |
| 4,316,757 A | 2/1982 | Walsh | |
| 4,394,414 A | 7/1983 | Brown et al. | |
| 4,510,094 A | 4/1985 | Drahnak | |
| 4,530,879 A | 7/1985 | Drahnak | |
| 4,603,215 A | 7/1986 | Chandra et al. | |
| 4,640,939 A | 2/1987 | Cavezzan et al. | |
| 4,670,531 A | 6/1987 | Eckberg | |
| 4,677,137 A | 6/1987 | Bany et al. | |
| 4,699,813 A | 10/1987 | Cavezzan | |
| 4,705,765 A | 11/1987 | Lewis | |
| 4,712,092 A | 12/1987 | Boldridge, Jr. et al. | |
| 4,818,323 A | 4/1989 | d'Aragona et al. | |
| 4,879,430 A | 11/1989 | Hoffman | |
| 4,916,169 A | 4/1990 | Boardman et al. | |
| 4,968,559 A | 11/1990 | Kuroda et al. | |
| 4,999,242 A | 3/1991 | Ishiwata et al. | |
| 5,049,085 A | 9/1991 | Reylek et al. | |
| 5,089,536 A | 2/1992 | Palazzotto | |
| 5,091,483 A | 2/1992 | Mazurek et al. | |
| 5,110,388 A | 5/1992 | Komiyama et al. | |
| 5,118,567 A * | 6/1992 | Komiyama et al. | 428/345 |
| 5,139,804 A | 8/1992 | Hoffman | |
| 5,234,730 A | 8/1993 | Lautenschlaeger et al. | |
| 5,256,599 A | 10/1993 | Asetta et al. | |
| 5,286,815 A | 2/1994 | Leir et al. | |
| 5,300,788 A * | 4/1994 | Fan et al. | 257/13 |
| 5,334,430 A | 8/1994 | Ishikawa et al. | |
| 5,356,949 A | 10/1994 | Komiyama et al. | |
| 5,409,773 A | 4/1995 | Kessel et al. | |
| 5,414,297 A | 5/1995 | Morita et al. | |
| 5,476,566 A | 12/1995 | Cavasin | |
| 5,516,858 A * | 5/1996 | Morita et al. | 525/478 |
| 5,525,422 A | 6/1996 | Spies et al. | |
| 5,534,383 A | 7/1996 | Takahashi et al. | |
| 5,574,117 A | 11/1996 | Yoshida et al. | |
| 5,596,025 A | 1/1997 | Oxman et al. | |
| 5,604,038 A | 2/1997 | Denes et al. | |
| 5,622,900 A | 4/1997 | Smith | |
| 5,633,176 A | 5/1997 | Takasu et al. | |
| 5,705,016 A | 1/1998 | Senoo et al. | |
| 5,726,219 A * | 3/1998 | Hosomi et al. | 522/92 |
| 5,888,606 A | 3/1999 | Senoo et al. | |
| 5,958,794 A | 9/1999 | Bruxvoort et al. | |
| 5,994,204 A | 11/1999 | Young et al. | |
| 6,048,587 A | 4/2000 | Estrin | |
| 6,048,953 A | 4/2000 | Kawashima et al. | |
| 6,062,133 A | 5/2000 | Blalock | |
| 6,074,287 A | 6/2000 | Miyaji et al. | |
| 6,102,780 A | 8/2000 | Ishimaru | |
| 6,143,628 A | 11/2000 | Sato et al. | |
| 6,180,527 B1 * | 1/2001 | Farnworth et al. | 438/693 |
| 6,194,317 B1 | 2/2001 | Kaisaki et al. | |
| 6,204,203 B1 | 3/2001 | Liu et al. | |
| 6,214,520 B1 | 4/2001 | Wolk et al. | |
| 6,235,141 B1 | 5/2001 | Feldman et al. | |
| 6,265,460 B1 * | 7/2001 | Kawate et al. | 522/31 |
| 6,284,425 B1 | 9/2001 | Staral et al. | |
| 6,358,664 B1 | 3/2002 | Nirmal et al. | |
| 6,376,569 B1 | 4/2002 | Oxman et al. | |
| 6,447,884 B1 | 9/2002 | Burberry et al. | |
| 6,548,566 B1 | 4/2003 | Huebener et al. | |
| 6,551,906 B2 * | 4/2003 | Oka | 438/465 |
| 6,620,649 B2 | 9/2003 | Uchida | |
| 6,623,594 B1 * | 9/2003 | Yamamoto et al. | 156/344 |
| 6,627,037 B1 | 9/2003 | Kurokawa et al. | |
| 6,786,810 B2 | 9/2004 | Muilenburg et al. | |
| 6,792,991 B2 | 9/2004 | Thallner | |
| 6,794,751 B2 * | 9/2004 | Kumamoto | 257/738 |
| 6,879,026 B2 | 4/2005 | Fukumoto et al. | |
| 6,939,741 B2 | 9/2005 | Fukuoka et al. | |
| 6,960,617 B2 | 11/2005 | Omidian et al. | |
| 7,064,069 B2 | 6/2006 | Draney et al. | |
| 7,129,150 B2 | 10/2006 | Kawai | |
| 7,192,688 B2 | 3/2007 | Klang et al. | |
| 7,198,853 B2 | 4/2007 | Ushio et al. | |
| 7,201,969 B2 | 4/2007 | Miyakawa et al. | |
| 7,226,812 B2 | 6/2007 | Lu et al. | |
| 7,244,495 B2 | 7/2007 | Kozakai et al. | |
| 7,268,061 B2 | 9/2007 | Miyanari et al. | |
| 7,452,752 B2 | 11/2008 | Noda et al. | |
| 7,534,498 B2 | 5/2009 | Noda et al. | |
| 7,858,499 B2 | 12/2010 | Plaut et al. | |
| 2001/0018404 A1 | 8/2001 | Oshima et al. | |
| 2001/0031837 A1 | 10/2001 | Perez et al. | |
| 2001/0036676 A1 | 11/2001 | Mitsuhashi et al. | |
| 2002/0007910 A1 | 1/2002 | Bennett et al. | |
| 2002/0050061 A1 | 5/2002 | Komyoji et al. | |
| 2002/0062919 A1 | 5/2002 | Oxman et al. | |
| 2002/0076848 A1 | 6/2002 | Spooner et al. | |
| 2003/0001283 A1 * | 1/2003 | Kumamoto | 257/778 |
| 2003/0079828 A1 | 5/2003 | Kassir et al. | |
| 2003/0235937 A1 * | 12/2003 | Mong et al. | 438/106 |
| 2004/0080047 A1 | 4/2004 | Wada et al. | |
| 2004/0126575 A1 | 7/2004 | Yoshida et al. | |
| 2004/0185639 A1 | 9/2004 | Fukuoka et al. | |
| 2004/0191510 A1 | 9/2004 | Kiuchi et al. | |
| 2004/0213994 A1 | 10/2004 | Kozakai et al. | |
| 2004/0259332 A1 | 12/2004 | Fukuoka et al. | |
| 2004/0265599 A1 | 12/2004 | Ushio et al. | |
| 2005/0016464 A1 | 1/2005 | Duggal et al. | |
| 2005/0031795 A1 | 2/2005 | Chaudhury et al. | |
| 2005/0085050 A1 | 4/2005 | Draney et al. | |
| 2005/0154089 A1 | 7/2005 | Taylor et al. | |
| 2005/0170612 A1 | 8/2005 | Miyanari et al. | |
| 2005/0208296 A1 | 9/2005 | Saiki et al. | |
| 2005/0233547 A1 | 10/2005 | Noda et al. | |
| 2005/0236107 A1 | 10/2005 | Doi et al. | |
| 2006/0040113 A1 | 2/2006 | Deruelle et al. | |
| 2006/0073334 A1 | 4/2006 | Schwantes et al. | |
| 2006/0211220 A1 | 9/2006 | Sakaya et al. | |
| 2006/0252234 A1 | 11/2006 | Saiki | |
| 2006/0292887 A1 | 12/2006 | Hara | |
| 2007/0190318 A1 | 8/2007 | Asai et al. | |
| 2008/0011415 A1 | 1/2008 | Kiuchi et al. | |
| 2008/0014532 A1 | 1/2008 | Kessel et al. | |
| 2008/0038540 A1 | 2/2008 | Hirayama et al. | |
| 2008/0071044 A1 | 3/2008 | Keite-Telgenbuscher et al. | |
| 2009/0075008 A1 | 3/2009 | Hwang et al. | |
| 2011/0064948 A1 | 3/2011 | Plaut et al. | |

FOREIGN PATENT DOCUMENTS

| | | |
|---|---|---|
| DE | 100 51 938 A1 | 2/2002 |
| EP | 0 238 033 | 9/1987 |
| EP | 0 571 649 A1 | 12/1993 |
| EP | 0 976 802 A1 | 2/2000 |
| EP | 0 977 254 A2 | 2/2000 |
| EP | 0 999 250 A2 | 5/2000 |
| EP | 1 167 483 A1 | 1/2002 |
| EP | 1 229 388 A1 | 8/2002 |
| EP | 1 354 925 A1 | 10/2003 |
| EP | 1 683 195 B1 | 5/2008 |
| JP | 54-133585 | 10/1979 |
| JP | 63-30581 | 2/1988 |
| JP | 05-335411 | 12/1993 |
| JP | 06-132432 | 5/1994 |
| JP | 6-302569 | 10/1994 |
| JP | 6302569 | 10/1994 |
| JP | 7-145357 | 6/1995 |
| JP | 8-53655 | 2/1996 |
| JP | 11-026404 | 1/1999 |
| JP | 11-283279 | 10/1999 |
| JP | 11283279 | 10/1999 |
| JP | 2000-038556 | 2/2000 |
| JP | 2000-040677 | 2/2000 |
| JP | 2000-195826 | 7/2000 |
| JP | 2002-203827 | 7/2002 |
| JP | 2002-353170 | 12/2002 |
| JP | 2003200436 | 7/2003 |
| JP | 2004-64040 | 2/2004 |
| JP | 2004-349441 | 12/2004 |
| JP | 2006-104246 | 4/2006 |

| JP | 2007-009131 | 1/2007 |
| WO | WO 98/12075 | 3/1998 |
| WO | WO 01/35457 A1 | 5/2001 |
| WO | 02/06413 A1 | 1/2002 |
| WO | WO 03/017363 A1 | 2/2003 |
| WO | WO 03/060972 A1 | 7/2003 |
| WO | WO 03/085714 A1 | 10/2003 |
| WO | WO 2004/006296 | 1/2004 |
| WO | WO 2005/057651 | 6/2005 |

OTHER PUBLICATIONS

Crivello et al., "Cationic Photopolymerization of Ambifunctional Monomers", *Macromol. Symp.*, 95 (1995), pp. 79-89.

Silicon Compounds, *Encyclopedia of Chemical Technology*, Fourth Edition, vol. 22, John Wiley & Sons, pp. 94-98.

Silicon Polymers, *Encyclopedia of Polymer Science and Engineering*, vol. 15, John Wiley & Sons, (1989), pp. 234-243.

Polysiloxane Cures, *Encyclopedia of Polymer Science and Engineering*, vol. 15, John Wiley & Sons, (1989), p. 252.

"Photopolymerizable Silicone Monomers, Oligomers and Resins", *Radiation Curing Science and Technology*, Plenum Press, New York, (1992), pp. 200-214.

Nol, Walter; *Chemistry and Technology of Silicones*, Academic Press, New York (1968).

Plueddemann et al., "Epoxyorganosiloxanes", *J. Am. Chem. Soc.*, vol. 81, Jun. 5, 1959, pp. 2632-2635.

Stark et al., "Silicones", *Comprehensive Organomettalic Chemistry—The Synthesis, Reactions and Structures of Organometallic Compounds*, vol. 2, Pergamon Press, New York, Chapter 9.3, (1982), pp. 329-330.

Tomanek, Andreas; *Silicone & Technik*, Wacker-Chemie GmbH, München, (1990).

* cited by examiner

SEMICONDUCTOR SURFACE PROTECTING METHOD

This application is a 371 of PCT/US04/34134 filed Oct. 15, 2004, which claims priority on application JP2003-382717 filed Nov. 12, 2003 currently abandoned.

TECHNICAL FIELD

The present invention relates to a semiconductor surface protecting method and surface protecting sheet for protection of the circuit-containing sides of a semiconductor wafer during the process of back side grinding of the wafers. More specifically, the invention relates to a semiconductor surface protecting method and surface protecting sheet which permits ultrathin back side grinding of semiconductor wafers, or which permits back side grinding of semiconductor wafers having high protrusions such as solder bumps on the circuit side.

BACKGROUND

Thinning (also referred to herein as "grinding") of semiconductor wafers has conventionally been accomplished by "back side grinding" methods whereby the circuit side of a wafer is protected with a surface protecting sheet and the back side opposite the circuit side is ground. The thicknesses of silicon wafers are generally 150 μm on an industrial level, but even thinner wafer thicknesses are desired. When wafers are ground to even smaller thicknesses, the phenomenon of unevenness of the ground surface (back side) due to irregularities on the circuit side, i.e., the phenomenon of transfer of the circuit pattern to the back side, becomes more notable. The cause of this back side transfer phenomenon is explained as follows. Presently employed pressure sensitive adhesive surface protecting sheets are limited in their ability to conform to the irregularities of the circuitry on a semiconductor wafer. As a result, gaps (air pockets) are created between the pressure-sensitive adhesive layer and the circuit side, such that the wafer is not directly supported by the pressure-sensitive adhesive (protective layer) in those areas. When the wafer is ground very thin, the wafer shifts in the vertical direction at the unsupported scribe lines (street) between the circuit die while compressing the air pockets with the result that the wafer is not ground in these areas, and remains thicker than the other portions. On the other hand, when hard protrusions such as bumps are present, the wafer is ground to a greater degree and thus becomes thinner than the other portions. This phenomenon is not a problem if the finished thickness is 150 μm or greater, but if the wafer is thinned to less than 100 μm (especially when finishing to a thickness of 50 μm or less), or if tall protrusions such as bumps are present on the wafer circuit side (for example, at 100 μm or greater), not only is the transverse strength of the wafer reduced considerably, but in severe cases the wafer can even be damaged during grinding. Also, when a wafer is thinly ground to about 50 μm edge chipping of the wafer or penetration of grinding water between the wafer and surface protecting layer can constitute a problem, but this has also been caused by a lack of adhesion of the surface protecting sheet to the wafer edges. In addition, with semiconductor wafers which are thin and also have bumps or other protrusions of 100 μm or greater on the circuit side, it is difficult to accomplish grinding by attachment of typical surface protecting sheets.

A conventional surface protecting sheet is usually a sheet having a pressure-sensitive adhesive layer as a surface protecting layer on a polymeric film material. The pressure-sensitive adhesive is designed so as to have a low elastic modulus in order to follow irregularities on the circuit side. If this tendency is too strong, however, the wafer can undergo considerable stress and suffer damage when the sheet is removed by peeling from the wafer. This has led to the development of energy beam peelable protecting sheets wherein the pressure-sensitive adhesive is hardened by irradiation with an energy beam such as ultraviolet rays to lower the adhesive strength between the wafer and protecting sheet before peeling. However, an often occurring problem is that the pressure-sensitive adhesive layer is too flexible in the unhardened state during grinding, and the wafer thus suffers damage during grinding.

Japanese Unexamined Patent Publication HEI No. 11-26404 discloses a wafer grinding method whereby the aforementioned energy beam peelable protecting sheet is attached to a circuit-formed wafer and the pressure-sensitive adhesive layer is hardened with an energy beam, after which the back side of the wafer is ground. However, since the pressure-sensitive adhesive is not fluid, its conformability against irregularities on the wafer circuit side is not adequate.

Japanese Unexamined Patent Publication No. 2000-38556 discloses a hot-melt semiconductor surface protecting sheet. The hot-melt sheet melts and exhibits fluid properties by heating at 60-100° C., and thus is able to conform to irregularities on the circuit side and exhibit excellent grinding properties. However, the sheet repeatedly melts when the temperature rises above the melting point. In most cases, a semiconductor wafer which has been laminated with a protective sheet is subjected to subsequent heating during lamination of a film used for attachment of chips, or a "die attachment film" (hereinafter referred to as "DAF"), or during a metal film forming step by sputtering. As a result, the temperature increase produced in such steps has caused problems including remelting of the protective sheet.

SUMMARY OF THE INVENTION

It is an object of one aspect of the present invention to provide a semiconductor surface protecting method employing a material having an adequate conformability for irregularities on a semiconductor wafer circuit side and sufficient rigidity as a support during grinding, and which does not become fluid with repeated temperature increase, as well as a surface protecting sheet which can be used in the method.

Generally, the invention provides a semiconductor surface protecting method whereby the circuit side of a semiconductor wafer is protected during the process of back side grinding of the wafer, said method comprising joining the circuit side of the semiconductor wafer to a polymeric film material by means of a fluid surface protecting layer which hardens upon radiation exposure or heating, and hardening the surface protecting layer.

According to one mode, the invention provides a semiconductor surface protecting method whereby the circuit side of a semiconductor wafer is protected during the process of back side grinding of the wafer, the method comprising joining the circuit side of the semiconductor wafer to a polymeric film material via a surface protecting layer which is either fluid at room temperature or may be made so by heating and which hardens upon radiation exposure or heating, and hardening the surface protecting layer.

According to another mode, the invention provides a semiconductor surface protecting method whereby the circuit side of a semiconductor wafer is protected during back side grinding of the wafer, the method comprising providing a surface protecting sheet comprising a polymeric film material on which is formed a surface protecting layer which is solid at room temperature, becomes fluid upon heating and hardens upon exposure to radiation or upon heating to a temperature higher than the fluidizing temperature, heating said surface protecting sheet to render the surface protecting layer fluid, placing the circuit side of said semiconductor wafer in contact with the fluidized surface protecting layer, and hardening the surface protecting layer.

According to yet another mode, the invention provides a surface protecting sheet for protection of the circuit side of a semiconductor wafer during back side grinding of the wafer, the surface protecting sheet comprising a polymeric film material on which is provided a surface protecting layer which is solid at room temperature, becomes fluid upon heating and hardens upon exposure to radiation or upon heating to a temperature higher than the fluidizing temperature.

In the aforementioned methods, the surface protecting layer contacts the wafer circuit side while in a fluid state and therefore a sufficient conformability is provided for the surface profile formed on the circuit side. The protecting layer having sufficient conformability exhibits high rigidity when hardened, and thus protects the wafer circuit side. Also, once the protecting layer is hardened, it does not refluidize during subsequent heating steps such as a die attachment film laminating step or sputtering metal film formation step.

The aforementioned protecting methods may be carried out using the aforementioned surface protecting sheet.

Throughout the present specification, the term "fluid" refers to the state of the viscoelastic profile of a sample wherein the elastic shear loss modulus (G") is greater than the elastic shear storage modulus (G'), or Tan $\delta(=G''/G')$ is greater than, or equal to, one.

Throughout the present specification, the terms "elastic shear storage modulus (G')" and "elastic shear loss modulus (G")" refer, respectively, to the elastic shear storage modulus and elastic shear loss modulus of the surface protecting layer material before hardening. The shear storage and loss moduli values are recorded on a chart using a viscoelasticity measuring apparatus at a frequency of 10 Hz, a deformation of 0.04% and a temperature-ramp rate of 3° C./min.

More specifically, they were measured using a viscoelasticity measuring apparatus (ARES, product of Rheometrics), for test samples of the surface protecting layers having a diameter of 25 mm and a thickness of 0.6 mm.

The terms "elastic tensile storage modulus (E')" and "elastic tensile loss modulus (E")" refer, respectively, to the elastic tensile storage modulus and elastic tensile loss modulus after hardening. The tensile storage and loss moduli values are recorded on a chart using a viscoelasticity measuring apparatus at a frequency of 1 Hz, a deformation of 0.04% and a temperature-ramp rate of 5° C./min.

More specifically, they were measured using a viscoelasticity measuring apparatus (SOLIDS ANALYZER RSA II, product of Rheometrics), for test samples of the surface protecting layers cut to 22.7 mm×10 mm×50 μm, after hardening (for example, after ultraviolet irradiation for 3 seconds with an 80 W/cm high-pressure mercury lamp).

The invention will now be explained in greater detail with reference to the accompanying drawings.

Figure 1A:
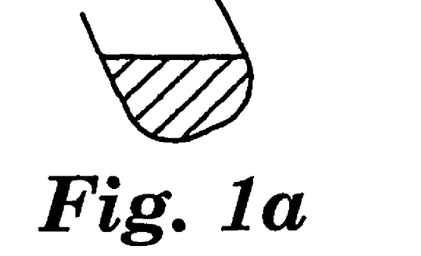
Figure 1B:
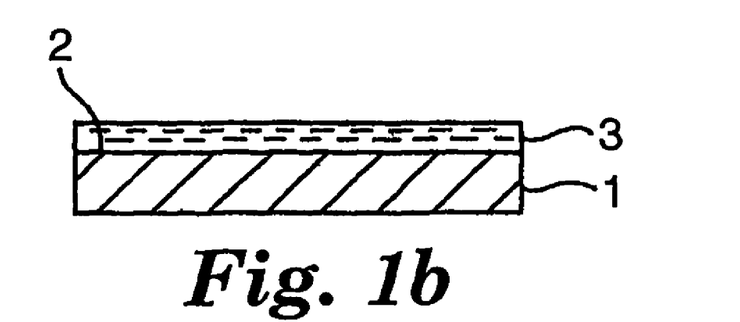
Figure 1C:
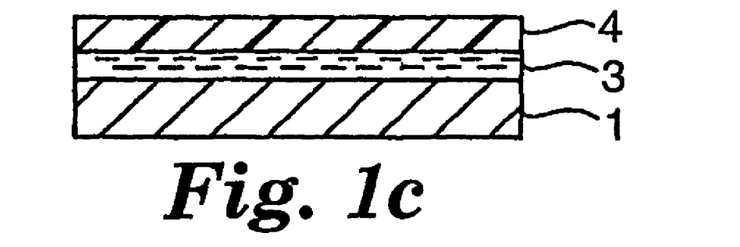
Figure 1D:
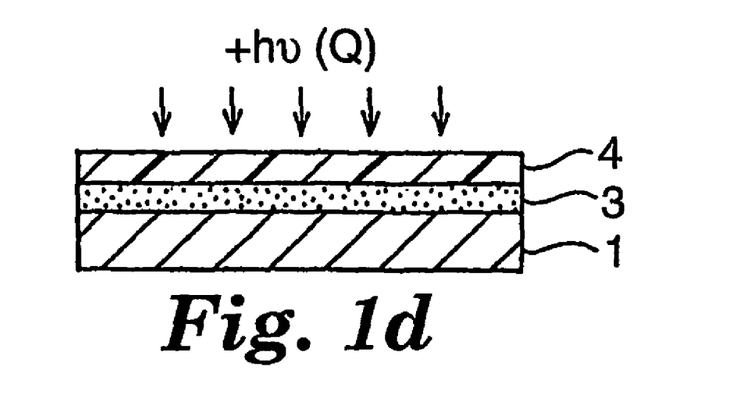

FIG. 1 is a first flow chart for one embodiment of the semiconductor surface protecting method of the invention.

First, a fluid surface protecting layer material which can be hardened by light or heat is provided (Step (a)). The material of the surface protecting layer may be a liquid at room temperature (about 20-25° C.) or a solid at room temperature which is fluidized by heating. The surface protecting layer 3 material is then evenly coated on the circuit side 2 of a wafer 1 (Step (b)). A polymeric film material 4 is then placed over the protecting layer 3 (Step (c)), and the protecting layer 3 is hardened by ultraviolet rays or heating (Step (d)). During this procedure, care must be taken to avoid inclusion of air at the interface between the protecting layer 3 and the wafer 1, the interface between the protecting layer 3 and the polymeric film material 4, or in the protecting layer 3. Inclusion of air will prevent a smooth grinding surface on the wafer, making it impossible to thinly grind the wafer to an even thickness, or possibly leading to damage of the wafer during grinding. Conducting the procedure in a vacuum can prevent air inclusion.

Figure 2A:
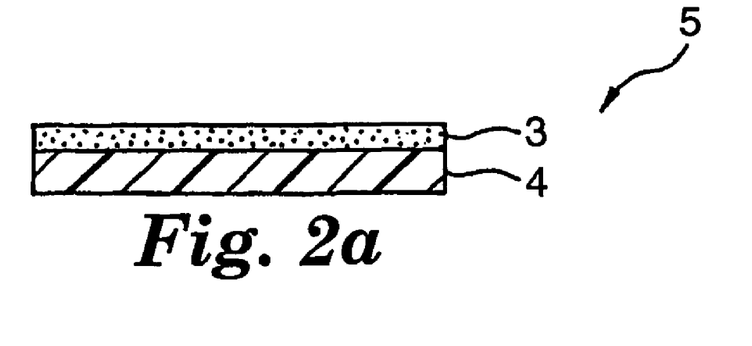
Figure 2B:
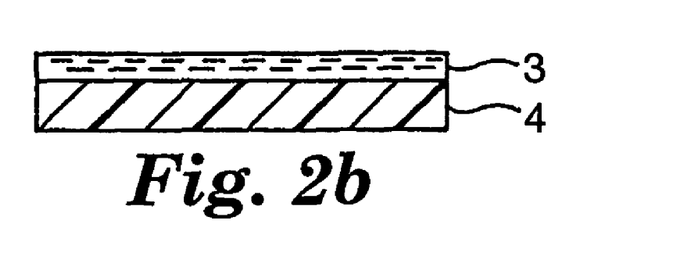
Figure 2C:
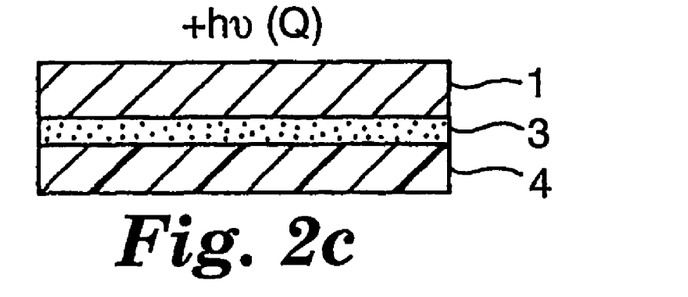
Figure 2D:
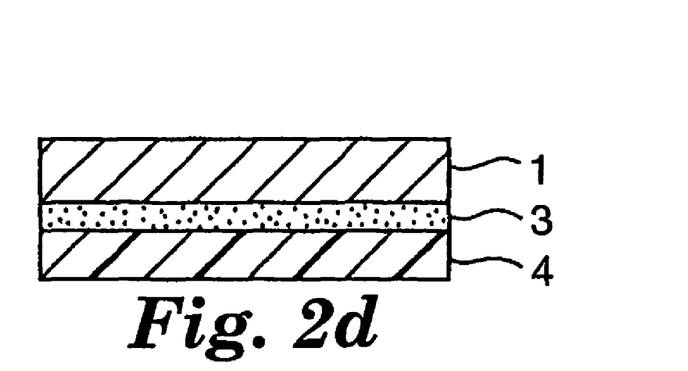

FIG. 2 is a second flow chart for another embodiment of the semiconductor surface protecting method of the invention.

First, a surface protecting layer 3, which is a solid at room temperature (about 20-25° C.) and which can be hardened by light irradiation or heating at high temperature is formed on a polymeric film material 4 to prepare a surface protecting sheet 5 (Step (a)). This may be done using solution coating and drying methods or by hot melt coating methods. Next, the surface protecting sheet 5 is heated at a sufficient temperature for fluidization of the protecting layer 3 (Step (b)). The wafer 1 is placed over the fluidized protecting layer so that the circuit side 2 is in contact with the protecting layer 3 (Step (c)). A solid is formed again upon cooling of the protecting layer 3 (Step (c')). Reforming the solid will facilitate handling of the wafer/protecting sheet laminate. The protecting layer 3 may then hardened by ultraviolet rays or heat. If heat is employed, then the temperature used is greater that that required for fluidization of the surface protecting layer (Step (d)). This series of steps may also be carried out in a vacuum for the same reasons as in the first flow chart. However, it was found more convenient to conduct the heating of Step (b) and the contact of Step (c) using a heating laminator. When a heating laminator is used, inclusion of air can be prevented by gradually contacting the wafer 1 with the heat-fluidized protecting layer 3 from the edge of the wafer.

BRIEF DESCRIPTION OF THE DRAWINGS

FIG. 1 is a first flow chart for a semiconductor surface protecting method of one embodiment of the invention.

FIG. 2 is a second flow chart for a semiconductor surface protecting method of another embodiment of the invention.

DETAILED DESCRIPTION

A surface protecting sheet of the invention will now be explained.

Surface Protecting Layer

In one embodiment the surface protecting layer of the surface protecting sheet of the invention is a material which is solid at room temperature, becomes fluid upon heating and hardens upon exposure to radiation or upon heating to a temperature higher than the fluidizing temperature. As mentioned above, the term "fluid" refers to the state of the viscoelastic profile of a sample wherein the elastic shear loss modulus (G") is greater than the elastic shear storage modulus (G'), or Tan $\delta(=G''/G')\geq 1$. The fluidizing temperature of the solid surface protecting layer is preferably 30-100° C. and more preferably about 35-60° C. If the temperature at which Tan $\delta=1$ is above 100° C., the procedure must be conducted at above 100° C. for lamination of the surface protecting sheet, which is disadvantageous in terms of equipment and productivity. If the temperature at which Tan $\delta=1$ is below 30° C., and especially below room temperature (20° C.), the storage stability will be poor when the sheet is wrapped into a roll and stored. The hardened protecting layer preferably has an elastic tensile storage modulus (E') of $5 \times 10^7$ Pa or greater at 50° C. This level of elastic modulus can ensure adequate rigidity as a support during grinding, and permit grinding of wafers to extremely thin and uniform thicknesses.

In another embodiment, the surface protecting layer is a fluid at room temperature and hardens upon exposure to radiation or upon heating to a temperature higher than room temperature.

Preferably, the surface protecting layer contains a polymerizable compound having two or more ethylenically unsaturated moieties or two or more cationically polymerizable groups in the molecule. As specific materials for the surface protecting layer which contain two or more ethylenically unsaturated moieties there may be mentioned free-radical polymerizable compounds such as (1) low molecular compounds which are crystalline or waxy at room temperature (20-5° C.), including isocyanuric acid-derived (meth)acrylates such as trisacryloxyethyl isocyanurate or trismethacryloxyethyl isocyanurate, pentaerythritol-derived (meth)acrylates such as pentaerythritol tetramethacrylate or pentaerythritol diacrylate monostearate, or bisphenol A-derived (meth)acrylates such as bisphenol A dimethacrylate; (2) urethane (meth)acrylate resins of molecular weight 10,000 or greater which are solid at room temperature; or (3) the following resins having a molecular weight of 1000 or greater which are solid at room temperature (20-25° C.): phenol-novolac epoxy (meth)acrylate resins, cresol-novolac epoxy (meth)acrylate resins and bisphenol A epoxy di(meth)acrylate resins.

As specific materials for the surface protecting layer there may also be suitably used cationic polymerizable compounds including 1) epoxy-based low molecular compounds such as hydroquinone diglycidyl ether or diglycidyl terephthalate, which are crystalline or waxy at room temperature; and 2) phenol-novolac epoxy resins, cresol-novolac epoxy resins and bisphenol A epoxy resins of molecular weight 1000 or greater which are solid at room temperature.

In another embodiment, the surface protecting layer is a fluid at room temperature and hardens upon exposure to radiation and/or upon heating to a temperature higher than room temperature. The material for the surface protecting layer may also contain a polymerizable compound which is liquid at ordinary temperatures, so long as the layer can be handled as a solid at ordinary temperatures after addition of each component. As examples of liquid free-radical polymerizable compounds there may be mentioned (meth)acrylate compounds such as trimethylolpropane tri(meth)acrylate, pentaerythritol tri(meth)acrylate, pentaerythritol tetra(meth)acrylate, dipentaerythritol monohydroxypenta(meth)acrylate, dipentaerythritol hexa(meth)acrylate and 1,6-hexanediol di(meth)acrylate, or vinyl ether derivatives such as ethyleneglycol divinyl ether.

As liquid cationically polymerizable compounds there may be mentioned a polyepoxide containing compounds such as sorbitol tetraglycidyl ether, pentaerythritol tetraglycidyl ether, trimethylolpropane triglycidyl ether and bisphenol A diglycidyl ether, and the like.

The surface protecting layer may further contain a thermoplastic resin having a melting point or softening point in a range of 25-100° C. together with the polymerizable compound, in an amount which does not impede the object of the invention. Representative examples of thermoplastic resins include polyolefin copolymers such as low density polyethylene (LDPE), ethylene-ethyl acrylate copolymer (EEA), ethylene-vinyl acetate copolymer (EVA) and ionomer resins (IONO), thermoplastic elastomers such as butadiene-based elastomers, styrene-isoprene based elastomers and ester-based elastomers, acrylic resins such as methyl methacrylate, polyvinyl chloride-based resins such as vinyl chloride-vinyl acetate copolymer, thermoplastic polyesters, polyurethane, and the like. These are used for the purpose of raising or adjusting the fluidizing temperature (Tan $\delta \geq 1$) of the surface protecting layer before hardening. They can also confer flexibility to the protecting layer after hardening.

When the surface protecting layer is a photosetting or photocurable type which is hardened by exposure to radiation, it will usually include a photoinitiator which absorbs light to produce free-radicals or cations in order to initiate the polymerization reaction. As specific free-radical polymerization initiators there may be mentioned benzoin, benzoin methyl ether, benzoin ethyl ether, benzoin isopropyl ether, benzyldiphenyl sulfide, azobisisobutyronitrile, dibenzyl, diacetyl, acetophenone, diethoxyacetophenone, 1-hydroxycyclohexylphenyl ketone, 2-hydroxy-2-methyl-1-phenylpropan-1-one and 2-benzyl-2-dimethylamino-1-(4-morpholinophenyl)-butanone-1, and as specific cationic polymerization initiators there may be mentioned allyldiazonium salts, allylsulfonium salts, allyliodonium salts and the like. The amount of the free radical polymerization initiator or cationic polymerization initiator is not particularly restricted, but will normally be 0.1-10 wt % based on the weight of the polymerizable compound.

For thermosetting types that are hardened by heating, the protecting layer will generally include a thermopolymerization initiator. Thermopolymerization initiators include azobisisobutyronitrile, benzoyl peroxide and the like.

The surface protecting layer may also contain an additive such as a filler, antioxidant, plasticizer or the like, in a range that does not impair the desired properties such as fluidity and post-hardening elastic tensile storage modules. The thickness of the surface protecting layer may be set as desired within a range of at least 10 μm greater than magnitude of the surface profile on the circuit-containing side of the semiconductor wafer, but considering uniformity of the total thickness of the surface protection sheet as a whole, it is generally 20-300 μm (inclusive), preferably 30-200 μm and more preferably 50-150 μm.

Polymeric Film Material

In one embodiment the polymeric film material supports the surface protecting layer to provide a sheet. The polymeric film material is not particularly restricted so long as it is a polymer film with a uniform thickness suitable for this use. However, when exposure to radiation such as ultraviolet rays or visible light rays is used to harden the surface protecting layer, it must be adequately permeable to ultraviolet rays (or visible light). For example, there may be used polyesters such as polyethylene terephthalate, polyolefin resins such as polypropylene, or polyvinyl chloride resins, polyvinylidene chloride resins, polyamide resins and the like. The thickness of the film is not particularly restricted, but is preferably such as to provide bending flexibility suitable for peeling removal of the film together with the protecting layer from the circuitized side of the wafer. The polymeric film material will therefore usually be 50-300 μm in thickness.

Manufacturing Method

In one embodiment the surface protecting sheet is manufactured in the following manner. A solid material forming the surface protecting layer is heated (at about 50-100° C., for example) to fluidize it. The fluid layer is then evenly coated onto a suitable polymeric film material such as a polyester film using appropriate means, such as a knife coater, and then allowed to cool to form a surface protecting sheet according to the invention. Alternatively, the solid material of the protecting layer may be dissolved in an appropriate solvent such as methyl ethyl ketone (MEK) to prepare a coating solution, and this solution may then be evenly coated onto a polymeric film material in the same manner and the solvent evaporated off to obtain a surface protecting sheet according to the invention.

Method of Using a Surface Protecting Sheet

In one embodiment the surface protecting sheet of the invention may be laminated by contact bonding to the circuit side of a semiconductor wafer either after heating or during heating. The sheet and circuit side of the wafer may also be contact bonded in a vacuum chamber. Such methods can accomplish complete lamination without inclusion of air bubbles.

The side opposite the circuit side of the wafer is ground to thin the wafer, with the circuit side protected by the surface protecting sheet. The ground surface is then processed by a polishing step. As polishing steps there may be mentioned chemical etching, chemical mechanical polishing (CMP), dry polishing or the like, which are commonly used for this purpose. Depending on the application, this may be followed by any desired metal film formation step such as sputtering or vapor deposition, or a step of laminating a die attachment film necessary for mounting of a chip. Although these steps are heating steps, the surface protecting sheet of the invention has adequate heat resistance and can therefore tolerate such steps. The wafer obtained by the aforementioned back side treatment steps is then attached by lamination of the ground and polished side to a dicing sheet, after which the surface protecting sheet is removed by peeling it off before the subsequent dicing step.

The above explanation assumes a semiconductor surface protecting method employing a surface protecting sheet, but as shown in the flow chart of FIG. 1, the method of the invention may also be carried out using a fluid protecting layer. The material for the protecting layer in this case may be the same material as used for the aforementioned protecting sheet, but it may also be a material which is fluid at room temperature. Consequently, there may be used free-radical polymerizable compounds which are liquid at room temperature, for example, trimethylolpropane tri(meth)acrylate, pentaerythritol tri(meth)acrylate, pentaerythritol tetra(meth)acrylate, dipentaerythritol monohydroxypenta(meth)acrylate, dipentaerythritol hexa(meth)acrylate and 1,6-hexanediol di(meth)acrylate, or vinyl ether derivatives such as ethyleneglycol divinyl ether, and cationically polymerizable compounds which are liquid at room temperature, for example, polyepoxide compounds such as sorbitol tetraglycidyl ether, pentaerythritol tetraglycidyl ether, trimethylolpropane triglycidyl ether and bisphenol A diglycidyl ether, and the like. The aforementioned thermoplastic resins may also be included.

The surface protecting sheet of the invention is not limited to protection of the circuit side of a semiconductor wafer, and may instead be effectively applied for other uses requiring a conformability to surface irregularities.

EXAMPLES

1. Protecting Layer Composition for Surface Protecting Sheet, and Manufacture and Testing of Protecting Sheets Mixtures having the following compositions were used as materials for protecting layers of surface protecting sheets. The compositions for Examples 1-3 and the Comparative Example were solid at room temperature. The composition for Example 4 was liquid at room temperature.

1.1. Protecting Layer Composition

Example 1 (Ultraviolet Curing Solid Protecting Layer)

TABLE 1

| Chemical Name | Product Name | Weight Percent |
| --- | --- | --- |
| Urethane acrylate | UV3520TL | 76.1% |
| Tris(acryloxyethyl)isocyanurate | M315 | 19.1% |
| 2-Benzyl-2-dimethylamino-1-(4-morpholinophenyl)-butanone-1 | Irgacure 369 | 4.8% |
| | | 100.0% |

Example 2 (Ultraviolet Curing Solid Protecting Layer)

TABLE 2

| Chemical Name | Product Name | Weight Percent |
| --- | --- | --- |
| Urethane acrylate | UV3510TL | 76.2% |
| Bisphenol A diacrylate | VR90 | 19.0% |
| 2-Benzyl-2-dimethylamino-1-(4-morpholinophenyl)-butanone-1 | Irgacure 369 | 4.8% |
| | | 100.0% |

Example 3 (Ultraviolet Curing Solid Protecting Layer)

TABLE 3

| Chemical Name | Product Name | Weight Percent |
| --- | --- | --- |
| Urethane acrylate | UV3510TL | 57.1% |
| Bisphenol A diacrylate | VR90 | 38.1% |
| 2-Benzyl-2-dimethylamino-1-(4-morpholinophenyl)-butanone-1 | Irgacure 369 | 4.8% |
| | | 100.0% |

Example 4 (Ultraviolet Curing Liquid Protecting Layer)

TABLE 4

| Chemical Name | Product Name | Weight Percent |
| --- | --- | --- |
| Urethane acrylate | UV6100B | 57.1% |
| 1,6-Hexanedioldiacrylate | 1,6-HX-A | 38.1% |
| 2-Benzyl-2-dimethylamino-1-(4-morpholinophenyl)-butanone-1 | Irgacure 369 | 4.8% |
| | | 100.0% |

Comparative Example (Thermoplastic Surface Protecting Layer) "pbw" Means Parts by Weight

TABLE 5

| Chemical Name | Product Name | Weight Percent |
|---|---|---|
| Reaction product of 100 pbw of a copolymer of butyl acrylate:2-hydroxyethyl acrylate (70:30 w/w) and 30 pbw methacryloyloxy ethyl isocyanate | — | 98.5% |
| Trifunctional isocyanate derived from toluene diisocyanate and 2-ethyl-2-(hydroxymethyl)-1,3-propanediol | Coronate L | 0.5% |
| 2-Benzyl-2-dimethylamino-1-(4-morpholinophenyl)-butanone-1 | Irgacure 369 | 1.0% |
|  |  | 100.0% |

UV3510TL (Nippon Synthetic Chemical Industry Co., Ltd.)
UV3520TL (Nippon Synthetic Chemical Industry Co., Ltd.)
1,6-HX-A (KYOEISHA CHEMICAL CO., LTD)
VR90 (SHOW A HIGHPOLYMER CO., LTD)
M315 (Toa Gosei Kagaku Co., Ltd.)
Irgacure 369 (Ciba Specialty Chemicals)
Coronate L (Nippon Polyurethane Industry Co., Ltd.)

1.2. Manufacture of Surface Protecting Sheet

A) Solid (at Room Temperature) Surface Protection Layer

A 70% solids by weight solution of each of the surface protecting layer composition in MEK (methyl ethyl ketone) was prepared using the compositions of Examples 1-3 and the Comparative Example. These solutions were then knife coated onto 100 μm thick polyethylene terephthalate (PET) films and dried in an oven at 100° C. to provide surface protecting sheets having a surface protecting layer thickness of about 50 μm.

B) Liquid (at Room Temperature) Surface Protection Layer

The composition of Example 4, which had a room temperature viscosity of 100 centipoise when measured at a shear rate of 1.86 sec$^{-1}$, was spin-coated onto a semiconductor wafer.

The resulting surface protecting layer had a thickness of about 50 μm.

1.3. Lamination

A) Solid (at Room Temperature) Surface Protection Layer

The surface protecting sheets of the examples were each taped at their edges to a glass plate which was held to the bottom face of a vacuum chamber such that the surface protecting layer was exposed, then heated to 70° C. with hot air to fluidize the surface protecting layer to a highly viscous liquid state. Next, the vacuum chamber was lowered down over a silicon wafer having its circuit pattern side facing upward and then the chamber was evacuated prior to releasing the glass plate with the protection sheet/fluidized surface protecting layer taped thereto, and contacting it to the circuitized side of the wafer. The vacuum chamber was removed and the glass plate was detached from the surface protecting sheet/semiconductor wafer article. The protecting layer was then hardened by exposure to ultraviolet rays from the polymeric film material side. This was done using a Fusion UV lamp ("Light Hammier" LH6, available from Fusion UV Systems Inc., Gaithersburg, Md.) which provided a UV intensity distribution on an 8 inch semiconductor wafer as follows: about 240 milliWatts/cm$^2$ at the center point of the wafer and about 150 milliWatts/cm$^2$ at the edge of the wafer. The exposure time was 3 seconds.

The surface protecting sheet of the Comparative Example was fluidized and laminated onto the circuit pattern side of a silicon wafer at a temperature of about 60° C. using a hand roller.

B) Liquid (at Room Temperature) Surface Protection Layer

A glass plate having a polyester film taped thereto was secured to the bottom of a vacuum chamber. Next, the vacuum chamber was lowered down over a silicon wafer whose circuitized, upward facing surface was covered with a liquid surface protecting layer coating. The chamber was then evacuated prior to releasing the glass plate with the polyester film taped thereto, and contacting the film to the liquid surface protecting layer on the wafer. The combination of the polyester film and liquid surface protecting layer formed a surface protection sheet on the wafer. The vacuum chamber was removed and the glass plate was detached from the surface protection sheet/semiconductor wafer article. The protecting layer was then hardened by exposure to ultraviolet rays from the polymeric film material side as described in Section A above.

1.4. Back Side Grinding

The silicon wafers protected on the circuit pattern sides with the surface protecting sheets of the Examples and Comparative Example were subjected to back side grinding to a 50 μm finish.

1.5. Heat Resistance Test

The silicon wafers protected on the circuit pattern sides with the surface protecting sheets of the Examples and Comparative Example were ground to a 50 μm thickness. The ground wafers, having the surface protection sheets thereon, were then placed on a 180° C. hot plate with the surface protecting sheet in contact with the hot plate and kept there for 3 minutes.

1.6. Confirmation of Conformability Property

The protecting sheet was removed by hand at a peeling angle of 180 degrees from the silicon wafer, and the protecting layer surface profile and wafer circuit side surface profile were measured using a contact roughness meter.

1.7. Viscoelastic Measurements

The elastic shear storage modulus (G') and elastic shear loss modulus (G") were measured using a viscoelastic measuring apparatus (ARES, available from Rheometrics) at a frequency of 10 Hz, a deformation of 0.04% and a temperature-ramp rate of 3° C./min. in temperature-ramp mode. The test samples of the unhardened surface protecting layers measured 25 mm in diameter and 0.6 mm in thickness. The elastic tensile storage modulus (E') and elastic tensile loss modulus (E") were measured using a viscoelastic measuring apparatus (SOLIDS ANALYZER RSA II, available from Rheometrics) at a frequency of 1 Hz, a deformation of 0.04% and a temperature-ramp rate of 5° C./min in temperature-ramp mode. The test samples of the hardened surface protecting layers measured 22.7 mm by 10 mm by 50 μm.

2. Test Results 2.1. Results of Viscoelasticity Profile Measurement

TABLE 6

|  |  | Example 1 | Example 2 | Example 3 | Example 4 |
|---|---|---|---|---|---|
| Before hardening | Temperature at which Shear tanδ = 1 | 35° C. | 45° C. | 43° C. | N.A. |
| After hardening | 50° C. elastic tensile storage modulus (E') | $9 \times 10^8$ (Pa) | $5 \times 10^7$ (Pa) | $3 \times 10^8$ (Pa) | $8 \times 10^7$ (Pa) |

2.2. Back Side Grinding

When the wafers protected with the protecting sheets of Examples 1-4 were subjected to back side grinding down to a thickness of 50 μm, satisfactory grinding results were obtained with no circuit pattern back side transfer or edge chipping. In the Comparative Example, however, circuit pattern backside transfer was already visible at a ground thickness of 100 μm, and continued grinding produced edge chipping at about half the outer periphery of the wafer, at a thickness of 70 μm. Finally, grinding down to 50 μm resulted in penetration of grinding water from the edge sections, and caused damage in most of the wafer.

2.3. Heat Resistance Test

For Examples 1-4 no problems were observed in peeling the surface protection layer from the wafer. The Comparative Example was difficult to peel off.

2.4. Confirmation of Conformability Property

The surface profile of the circuit side of the semiconductor wafer matched that of the surface protecting layer surface that contacted the circuit side of the wafer in Examples 1-4. This confirmed the ability of the surface protecting layer to conform to the circuit side irregularities.

According to the present invention, the surface protecting layer exhibits a sufficient conformability for the irregularities on semiconductor wafer circuit surfaces and sufficient rigidity as a support during grinding, while also not being fluidized upon repeated temperature increases. Therefore, problems such as circuit pattern back side transfer or wafer damage do not occur even with back side grinding down to extremely low thicknesses of about 50 μm.

In one embodiment the surface protecting layer of a surface protecting sheet of the invention is solid at room temperature and can be provided as a sheet article, and since it is converted to a fluid liquid adhesive upon heating at 30-100° C., it may be laminated after heating to sufficiently conform to circuit side irregularities. Also, since in the fluid state the surface protecting layer wraps around the wafer edges by surface tension, the wafer is supported by the protecting layer even at the edges. Moreover, since the protecting layer is hardened into a high elastic modulus material by exposure to ultraviolet rays before grinding, it is possible to achieve excellent grinding properties (no back side transfer of circuit side irregularities or wafer edge chipping, and no penetration of grinding water), similar to a system employing a liquid UV curing (or thermosetting) adhesive or wax for attachment of the wafer onto a hard substrate, such as by lamination. In other words, the protecting sheet of the invention achieves both the convenience of a sheet article and the excellent grinding properties of a process wherein the wafer is laminated onto a supporting substrate with a wax or liquid adhesive.

In another embodiment, the surface protecting layer may be provided as liquid at room temperature. Such a form permits coating directly onto an irregular surface followed by addition of a polymeric film to the liquid surface and subsequent hardening to provide a removable sheet article. This embodiment provides the same advantages as cited above.

The invention claimed is:

1. A semiconductor surface protecting method whereby the circuit side of a semiconductor wafer is protected during the step of back side grinding of the wafer, comprising in order:
    providing a fluid surface protecting layer,
    coating the fluid surface protecting layer on the circuit side of the semiconductor wafer,
    placing a polymeric film material over the fluid surface protecting layer,
    hardening said fluid surface protecting layer by exposure to radiation or upon heating, and
    grinding said semiconductor wafer,
    wherein grinding said semiconductor wafer is done after hardening said fluid surface protecting layer, whereby the coating, placing, and hardening steps are carried out in a vacuum.

2. A semiconductor surface protecting method according to claim 1, wherein, before hardening the fluid surface protective layer, the fluid surface protective layer has an elastic shear loss modulus (G") less than its elastic shear storage modulus (G') at room temperature (20-25°C.) and an elastic shear loss modulus (G") greater than its elastic shear storage modulus (G') at 30-100°C., as measured with a viscoelasticity measuring apparatus at a frequency of 10 Hz, a deformation of 0.04% and a temperature ramp rate of 3°C./min., and the surface protective layer after hardening has an elastic tensile storage modulus (E') at 50°C. greater than $5 \times 10^7$ Pa as measured with a viscoelasticity measuring apparatus at a frequency of 1 Hz, a deformation of 0.04% and a temperature-ramp rate of 5°C./min.

3. A semiconductor surface protecting method according to claim 1, wherein the fluid surface protecting layer contains at least one type of a free-radical polymerizable compound having two or more ethylenically unsaturated moieties in the molecule, the free-radical polymerizable compounds being selected from the group consisting of:
    (1) (meth)acrylic-based low molecular weight compounds, selected from isocyanuric acid-derived (meth)acrylates, pentaerythritol-derived (meth)acrylates or bisphenol A-derived (meth)acrylates, which are crystalline or waxy at room temperature (20-25°C.),
    (2) urethane (meth)acrylate resins of molecular weight 10,000 or greater which are solid at room temperature (20-25°C.), and
    (3) the following resins having a molecular weight of 1000 or greater which are solid at room temperature (20-25°C.): phenol-novolac epoxy (meth)acrylate resins, cresol-novolac epoxy (meth)acrylate resins and bisphenol A epoxy di(meth)acrylate resins.

4. A semiconductor surface protecting method according to claim 3, wherein the fluid surface protecting layer further contains a free-radical polymerization initiator.

5. A semiconductor surface protecting method according to claim 1, wherein the fluid surface protecting layer contains at least one cationically polymerizable compound having two or more cationically polymerizable groups in the molecule, the cationically polymerizable compounds being selected from the group consisting of:
    (1) epoxy-based low molecular compounds, selected from hydroquinone diglycidyl ether or diglycidyl terephthalate, which are crystalline or waxy at room temperature (20-25°C.), and
    (2) phenol-novolac epoxy resins, cresol-novolac epoxy resins and bisphenol A epoxy resins of molecular weight 1000 or greater which are solid at room temperature.

6. A semiconductor surface protecting method according to claim 5, wherein the fluid surface protecting layer further contains a cationic polymerization initiator.

7. A semiconductor surface protecting method according to claim 2, wherein the surface protecting layer contains at least one type of a free-radical polymerizable compound having two or more ethylenically unsaturated moieties in the molecule, the free-radical polymerizable compounds being selected from the group consisting of:
    (1) (meth)acrylic-based low molecular weight compounds, selected from isocyanuric acid-derived (meth)acrylates, pentaerythritol-derived (meth)acrylates or bisphenol A-derived (meth)acrylates, which are crystalline or waxy at room temperature (20-25°C.), (2) urethane (meth)acrylate resins of molecular weight 10,000 or greater which are solid at room temperature (20-25°C.), and
(3) the following resins having a molecular weight of 1000 or greater which are solid at room temperature (20-25°C.): phenol-novolac epoxy (meth)acrylate resins, cresol-novolac epoxy (meth)acrylate resins and bisphenol A epoxy di(meth)acrylate resins.

8. A surface protecting sheet according to claim 7, wherein the surface protecting layer further contains a free-radical polymerization initiator.

9. A semiconductor surface protecting method according to claim 2, wherein the fluid surface protecting layer contains at least one cationically polymerizable compound having two or more cationically polymerizable groups in the molecule, the cationically polymerizable compounds being selected from the group consisting of:
(1) epoxy-based low molecular compounds, selected from hydroquinone diglycidyl ether or diglycidyl terephthalate, which are crystalline or waxy at room temperature (20-25°C.), and
(2) phenol-novolac epoxy resins, cresol-novolac epoxy resins and bisphenol A epoxy resins of molecular weight 1000 or greater which are solid at room temperature.

10. A semiconductor surface protecting method according to claim 9, wherein the surface protecting layer further contains a cationic polymerization initiator.

11. A semiconductor surface protecting method according to claim 1, whereby the circuit side of a semiconductor wafer is protected during the step of back side grinding of the wafer, comprising in order:
providing a fluid surface protecting layer,
coating the fluid surface protecting layer on the circuit side of the semiconductor wafer,
placing a polymeric film material over the fluid surface protecting layer,
hardening said fluid surface protecting layer by exposure to radiation, and
grinding said semiconductor wafer,
wherein grinding said semiconductor wafer is done after hardening said fluid surface protecting layer.

* * * * *

UNITED STATES PATENT AND TRADEMARK OFFICE
CERTIFICATE OF CORRECTION

PATENT NO.        : 8,349,706 B2
APPLICATION NO.   : 10/595678
DATED             : January 8, 2013
INVENTOR(S)       : Kazuki Noda Page 1 of 1

It is certified that error appears in the above-identified patent and that said Letters Patent is hereby corrected as shown below:

Title Page
Item [73], Assignee, delete "Innovtive" and insert --Innovative--, therefor.

Title Page. Page 3
References Cited, OTHER PUBLICATIONS, delete "Organomettalic" and insert --Organometallic--, therefor.

Column 4
Line 29, delete "that that" and insert --than that--, therefor.

Column 5
Line 18, delete "(20-5°C.)," and insert --(20-25°C.)--, therefor.

Column 13
Line 10, in Claim 8, after "the" insert --fluid--.

Signed and Sealed this
Second Day of April, 2013

Teresa Stanek Rea
*Acting Director of the United States Patent and Trademark Office*